United States Patent
Lim

(10) Patent No.: US 8,049,288 B2
(45) Date of Patent: Nov. 1, 2011

(54) IMAGE SENSOR AND METHOD FOR MANUFACTURING THE SAME

(75) Inventor: Gun Hyuk Lim, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 155 days.

(21) Appl. No.: 12/508,036

(22) Filed: Jul. 23, 2009

(65) Prior Publication Data
US 2010/0025802 A1 Feb. 4, 2010

(30) Foreign Application Priority Data

Jul. 29, 2008 (KR) .................. 10-2008-0074144

(51) Int. Cl.
*H01L 27/14* (2006.01)
*H01L 21/00* (2006.01)

(52) U.S. Cl. ......... 257/431; 257/E31.053; 257/E21.158; 438/57

(58) Field of Classification Search .................. 257/461, 257/184, 292, 440, 428, E31.053, E21.158, 257/431, 414, 444; 438/98, 57, 59
See application file for complete search history.

(56) References Cited

U.S. PATENT DOCUMENTS

| 6,180,967 B1* | 1/2001 | Zanatta et al. ............... 257/184 |
| 2008/0093695 A1* | 4/2008 | Gao et al. ..................... 257/428 |

FOREIGN PATENT DOCUMENTS

| KR | 10-2005-0117674 A | 12/2005 |
| KR | 10-2007-0000578 A | 1/2007 |
| KR | 10-2008-0061434 A | 7/2008 |

* cited by examiner

*Primary Examiner* — Thomas L Dickey
*Assistant Examiner* — Nikolay Yushin
(74) *Attorney, Agent, or Firm* — Saliwanchik, Lloyd & Eisenschenk

(57) ABSTRACT

An image sensor is provided. The image sensor comprises a readout circuitry, interconnections, a first image sensing device, and a second image sensing device. The readout circuitry is disposed on a first substrate. The interconnections comprise a first interconnection and a second interconnection on the first substrate to be electrically connected to the readout circuitry. The first image sensing device is disposed over the first interconnection. The second image sensing device is disposed over the first image sensing device and electrically connected to the second interconnection.

17 Claims, 5 Drawing Sheets

IMAGE SENSOR AND METHOD FOR MANUFACTURING THE SAME

CROSS-REFERENCE TO RELATED APPLICATION

This application claims the benefit under 35 U.S.C. §119 of Korean Patent Application No. 10-2008-0074144, filed Jul. 29, 2008, which is hereby incorporated by reference in its entirety.

BACKGROUND

The present disclosure relates to an image sensor and a method for manufacturing the same.

An image sensor is a semiconductor device for converting an optical image into an electric signal. The image sensor may be roughly classified into a charge coupled device (CCD) image sensor and a complementary metal oxide semiconductor (CMOS) image sensor (CIS).

During the fabrication of image sensors, a photodiode may be formed in a substrate using ion implantation. As the size of a photodiode is reduced for the purpose of increasing the number of pixels without increasing chip size, the area of a light receiving portion is also reduced, thereby resulting in a reduction in image quality.

Also, since a stack height does not reduce as much as the reduction in the area of the light receiving portion, the number o f photons incident to the light receiving portion is also reduced due to diffraction of light called Airy disk.

As an alternative to overcome this limitation, an attempt of forming a photodiode using amorphous silicon (Si), or forming a readout circuitry in a silicon (Si) substrate using a method such as wafer-to-wafer bonding, and forming a photodiode on and/or over the readout circuitry has been made (referred to as a three-dimensional (3D) image sensor). The photodiode is connected with the readout circuitry through a metal interconnection.

On the other hand, while the demand on CIS having a wide dynamic range that can simultaneously express blight light and dark light increases, products that can meet the demand are deficient. In particular, products for a 3D image sensor that can sense an infrared ray as well as a visible ray are necessary.

Since both the source and the drain at the sides of the transfer transistor are usually heavily doped with N-type impurities, a charge sharing phenomenon occurs. When the charge sharing phenomenon occurs, the sensitivity of an output image is reduced and an image error may be generated. Also, because a photo charge does not readily move between the photodiode and the readout circuitry, a dark current is generated and/or saturation and sensitivity is reduced.

BRIEF SUMMARY

Embodiments provide an image sensor having wide dynamic range and a method for manufacturing the same, by using a 3D image sensor to increase a fill factor. According to embodiments, a 3D image sensor is providing having a low sensitivity infrared sensor on a wafer and a high sensitivity visible ray sensor over the wafer.

Embodiments also provide an image sensor where a charge sharing does not occur while increasing a fill factor and a method for manufacturing the same.

Embodiments also provide an image sensor that can minimize a dark current source and inhibit saturation reduction and sensitivity degradation by forming a smooth transfer path of a photo charge between a photodiode and a readout circuit, and a method for manufacturing the same.

In one embodiment, an image sensor comprises: a readout circuitry on a first substrate; interconnections comprising a first interconnection and a second interconnection on the first substrate and electrically connected to the readout circuitry; a first image sensing device over the first interconnection; and a second image sensing device over the first image sensing device.

In another embodiment, a method for manufacturing an image sensor comprises: forming a readout circuitry in a first substrate; forming interconnections comprising a first interconnection and a second interconnection on the first substrate and electrically connected to the readout circuitry; forming a first image sensing device over the first interconnection; and forming a second image sensing device over the first image sensing device.

The details of one or more embodiments are set forth in the accompanying drawings and the description below. Other features will be apparent from the description and drawings, and from the claims.

BRIEF DESCRIPTION OF THE DRAWINGS

FIG. 7A shows a plan view illustrating one example of an image sensor of an embodiment and FIG. 7B shows a plan view illustrating another example of the image sensor of an embodiment.

DETAILED DESCRIPTION OF THE EMBODIMENTS

Hereinafter, embodiments of an image sensor and a method for manufacturing the same will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
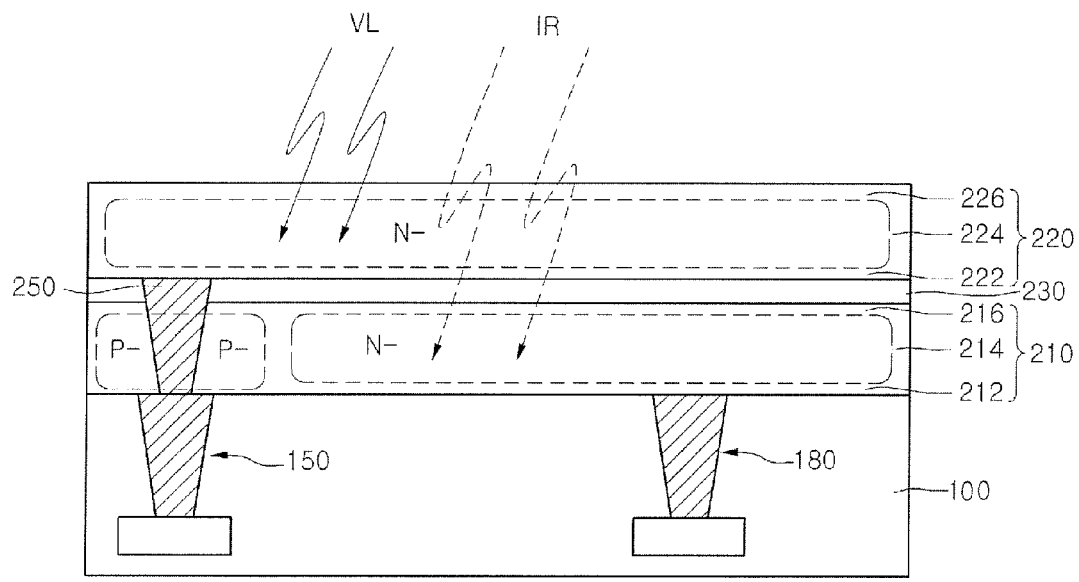
FIG. 1 is a cross-sectional view of an image sensor according to a first embodiment.

FIG. 1 is a cross-section view of an image sensor according to a first embodiment.

Referring to FIG. 1, the image sensor according to the first embodiment may include a first substrate 100 including a readout circuitry (not shown) and interconnections including first and second interconnections 180 and 150 that are electrically connected to the readout circuitry; a first image sensing device 210 on the first interconnection 180; and a second image sensing device 220 on the first image sensing device 210. The first image sensing device 210 can be used to sense infrared rays (IR) and the second image sensing device 220 can be used to sense visible light rays (VL).

The first image sensing device 210 and the second image sensing device 220 may be photodiodes. In other embodiments, without being limited thereto, the image sensing devices may include a photogate, or a combination of the photodiode and the photogate. Embodiments include a photodiode formed in a crystalline semiconductor layer as an example. However, embodiments are not limited thereto. For example, the photodiode may be formed in amorphous semiconductor layer.

Unexplained reference numerals in FIG. 1 will be described with reference to the drawings illustrating a method for manufacturing the image sensor and description below.

Hereinafter, a method for manufacturing an image sensor according to a first embodiment will be described with reference to FIGS. 2 to 6.

Figure 2A:
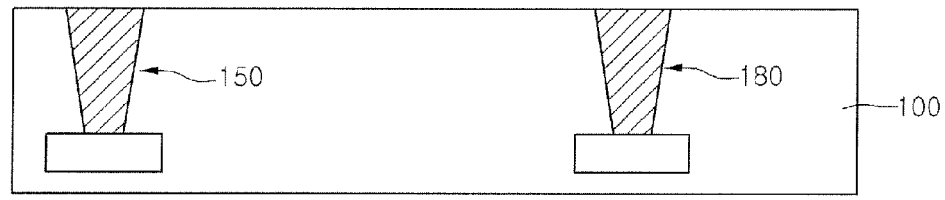
FIG. 2A shows a simplified cross-sectional view of a first substrate for illustrating a method for manufacturing an image sensor according to a first embodiment.
Figure 2B:
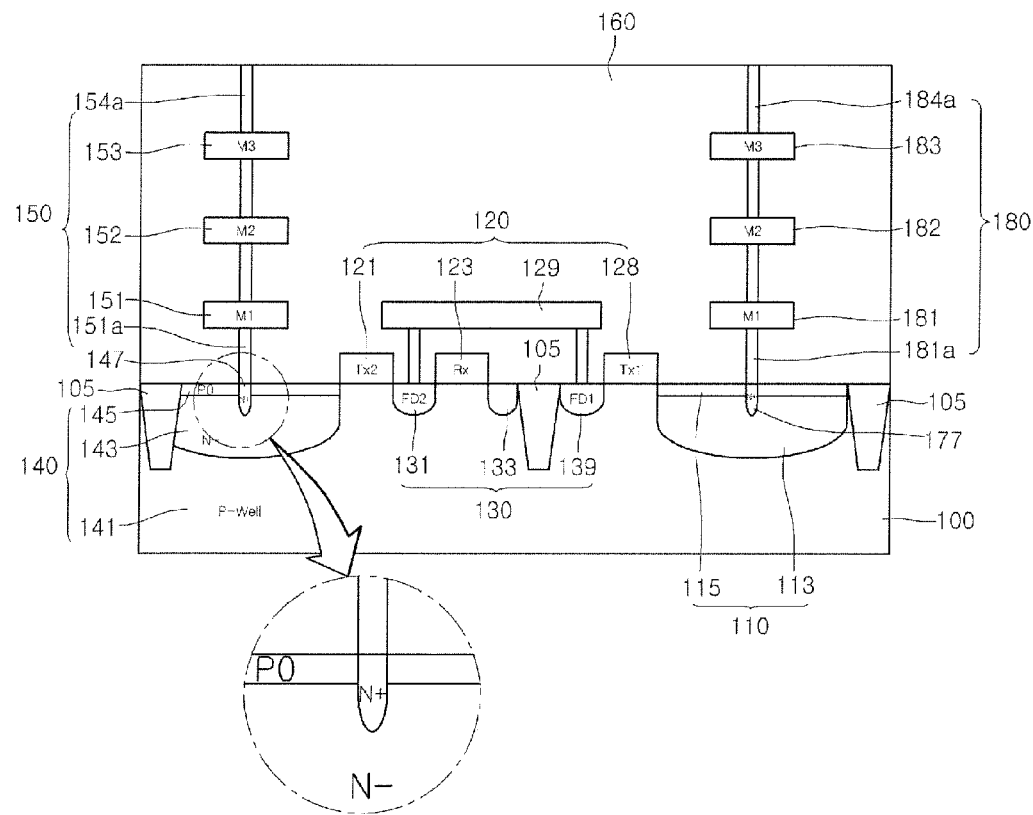
FIG. 2B shows a detailed cross-sectional view of a first substrate according to an embodiment.

FIG. 2A is a simplified view of the first substrate 100 including first and second interconnections 180 and 150. FIG. 2B is a view of the first substrate 100 including the interconnections connected to a readout circuit 120 in accordance with an embodiment of the present invention. Hereinafter, descriptions will be made on the basis of FIG. 2B.

Referring to FIG. 2B, the first substrate 100 including the interconnections including the first interconnection 180 and the second interconnection 150, and the readout circuitry 120 is prepared. For example, an active region is defined by forming a device separation layer 105 in the first substrate 100. The readout circuitry 120 including a transistor is formed in the active region. For example, the readout circuitry 120 may include a first transfer transistor (Tx1) 128, a second transfer transistor (Tx2) 121, a reset transistor (Rx) 123, a drive transistor (Dx, not shown), and a select transistor (Sx, not shown).

An ion implantation region 130 including a source/drain region 133 for each transistor, a first floating diffusion region (FD1) 139, and a second floating diffusion region (FD2) 131 may be formed.

In the first embodiment, a first electrical junction region 110 and a second electrical junction region 140 electrically connecting the readout circuitry 120 and the interconnections 150 and 180 may be formed.

The first embodiment may include forming the second electrical junction region 140 in the first substrate 100, and forming a first conductive connection 147 connected to the interconnection at an upper part of the second electrical junction region 140.

For example, the second electrical junction region 140 may be a P-N junction 140, but is not limited thereto. For example, the second electrical junction region 140 may include a first conductive-type ion implantation region 143 formed on a second conductive-type well 141 or a second conductive-type epitaxial layer, and a second conductive-type ion implantation layer 145 formed on the first conductive-type ion implantation region 143. For example, the P-N junction 140 may be a P0(145)/N-(143)/P-(141) junction, but embodiments are not limited thereto. The first substrate 100 can include a second conductive type substrate, but embodiments are not limited thereto.

According to an embodiment, the device is designed to provide a potential difference between the source and drain of each transfer transistor (Tx1,Tx2), thus implementing the full dumping of a photo charge. Accordingly, a photo charge generated in the photodiode is dumped to the floating diffusion region, thereby increasing the output image sensitivity.

That is, as shown in FIG. 2B, the second electrical junction region 140 is formed in the first substrate 100 including the readout circuit 120 to provide a potential difference between the source and drain of the second transfer transistor (Tx2) 121, thereby implementing the full dumping of a photo charge.

Hereinafter, a dumping structure of a photo charge according to an embodiment will be described in detail.

In an embodiment, unlike a floating diffusion (FD) 131 node of an N+ junction, the P/N/P junction 140 of the second electrical junction region 140 is pinched off at a predetermined voltage without an applied voltage being fully transferred thereto. This voltage is called a pinning voltage. The pinning voltage depends on the P0 (145) and N- (143) doping concentration.

Specifically, electrons generated in the second image sensing device 220 are transferred to the PNP junction 140, and they are transferred to the second floating diffusion (FD2) 131 node to be converted into a voltage when the second transfer transistor (Tx2) 121 is turned on.

The maximum voltage of the PNP junction 140 becomes the pinning voltage, and the maximum voltage of the FD2 131 node becomes $V_{dd}-V_{th\_Rx}$. Therefore, due to a potential difference between the source and drain of the Tx2 131, without charge sharing, electrons generated in the second photodiode 220 on the chip can be completely dumped to the FD2 131 node.

That is, in the embodiment, a P0/N-/P-well junction instead of an N+/P-well junction is formed in a silicon substrate (Si-Sub) of the first substrate 100. The reason for this is that, in a four transistor active pixel sensor (4-Tr APS) reset operation, a positive (+) voltage is applied to the N- region (143) in the P0/N-/P-well junction and a ground voltage is applied to the P0 region (145) and the P-well (141), and thus a P0/N-/P-well double junction generates a pinch-off at a predetermined voltage or higher, such as in a BJT structure. This is called a pinning voltage. Thus, a potential difference occurs between the source and drain of the Tx2 121, thus making it possible to inhibit a charge sharing phenomenon in a Tx on/off operation.

Thus, unlike the related art case of connecting a photodiode simply to an N+ junction, this embodiment makes it possible to inhibit saturation reduction and sensitivity degradation.

A first conductive connection 147 is formed between the photodiode and the readout circuit to create a smooth transfer path of a photo charge, thereby making it possible to minimize a dark current source and inhibit saturation reduction and sensitivity degradation.

To this end, the first embodiment may form a first conductive connection 147 for an ohmic contact on the surface of the P0/N-/P- junction 140. The N+ region (147) may be formed such that it pierces the P0 region (145) to contact the N- region (143).

On the other hand, the width of the first conductive connection 147 may be minimized to inhibit the first conductive connection 147 from being a leakage source. To this end, the embodiment may perform plug implant after etching a contact hole for first metal contact 151a, but embodiments are not limited thereto. For example, an ion implantation pattern (not shown) may be formed by another method, and the pattern may be used as an ion implantation mask to form the first conductive connection 147.

That is, the reason why an N+ doping is performed only on a contact formation region is to minimize a dark signal and help the smooth formation of an ohmic contact. If the entire Tx source region is N+ doped like the related art, a dark signal may increase due to an Si surface dangling bond.

Similarly, the first electrical junction region 110 may include an N-well 113 and a P0 layer 115, but embodiments are not limited thereto. That is, the first electrical junction region 110 may adopt the technical features of the second electrical junction region 140.

In the first embodiment, the first floating diffusion region 139 for the first image sensing device 210 may have the same electric potential as the second floating diffusion region 131 for the second image sensing device 220. For example, the FD node may be shared by connecting the first floating diffusion region 139 and the second floating diffusion region 131 through a first metal 129.

Next, an interlayer dielectric 160 may be formed on the first substrate 100, and a first interconnection 180 and a second interconnection 150 may be formed therein. The second interconnection 150 may include the first metal contact 151a, a first metal 151, a second metal 152, a third metal 153, and a fourth metal contact 154a, but embodiments are not limited thereto.

Similarly, the first interconnection 180 may include metal contacts 181a and 184a, and metal layers 181, 182 and 183. Also, the first interconnection 180 may further include a first conductive connection 177 connecting the first electrical junction region 110 and the first interconnection 180 electrically.

Figure 3:
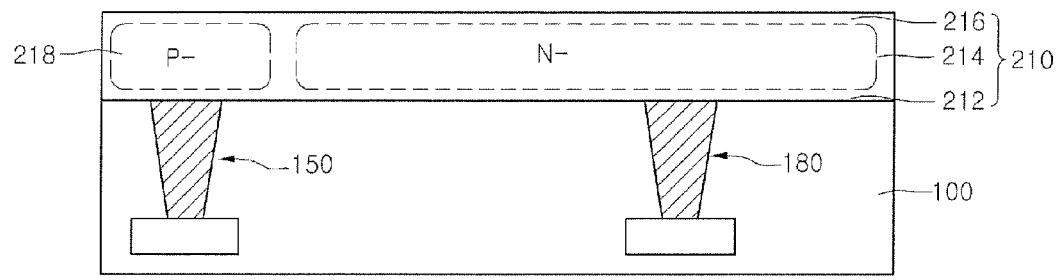
FIG. 3 shows a cross-sectional view illustrating a step in a method for manufacturing an image sensor according to a first embodiment.

Next, referring to FIG. 3, a first image sensing device 210 is formed on and electrically connected to the first interconnection 180. For example, the first image sensing device 210 including a first conductive layer 214 and a second conductive layer 216 can be formed on a second substrate (not shown). After the first substrate 100 is bonded to the second substrate to match the first conductive layer 214 with the first interconnection 180, the second substrate may be removed to leave the first image sensing device 210. In an embodiment, the first image sensing device 210 may further include a high-density conductive layer 212 for an ohmic contact to the first interconnection.

A second conductive-type ion implantation region 218 may be formed in the second substrate in a region over the second interconnection 150.

Figure 4:
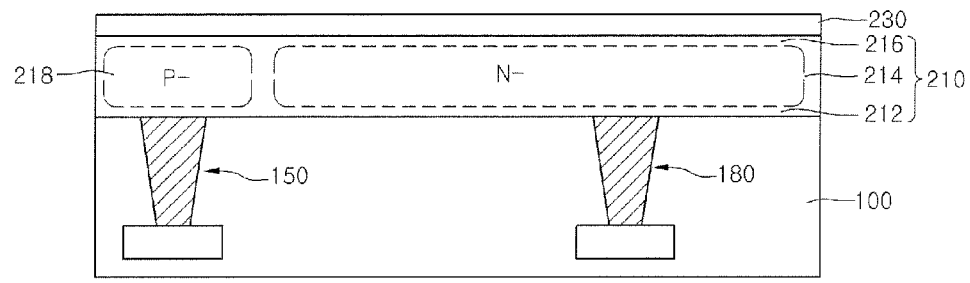
FIG. 4 shows a cross-sectional view illustrating a step in a method for manufacturing an image sensor according to a first embodiment.

Referring to FIG. 4, a separation layer 230 may be formed on the first image sensing device 210.

The forming of the separation layer 230 may include forming an insulating layer on the first image sensing device 210. For example, the separation layer 230 may be an insulating layer including an oxide and/or a nitride.

In another embodiment, the second conductive layer 216 may serve as a separation layer without a separate ion implantation (or deposition) because the upper part of the first image sensing device 210 includes the second conductive layer 216.

Hereinafter, the separation layer 230 formed using an insulating layer will be described as an example.

Figure 5:
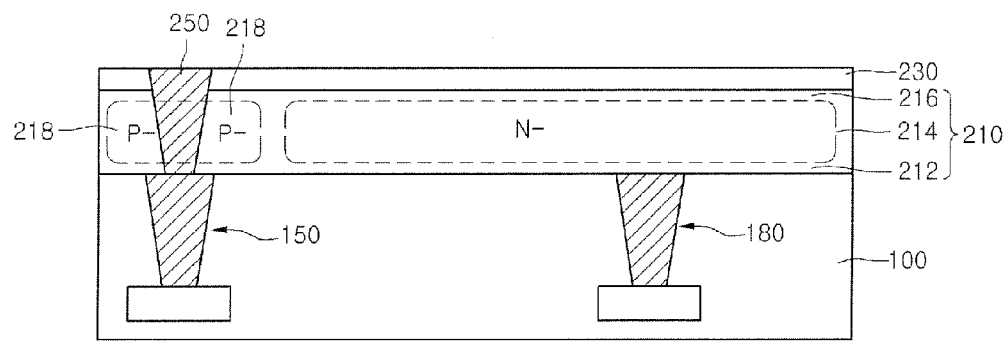
FIG. 5 shows a cross-sectional view illustrating a step in a method for manufacturing an image sensor according to a first embodiment.

As described FIG. 5, the method for manufacturing the image sensor may further include forming a third plug 250 penetrating the separation layer 230 over the second interconnection 150. In this case, the third plug 250 penetrates the first image sensing device 210 within the second conductive ion implantation layer 218 to inhibit electrons subsequently generated from the first image sensing device 210 from being delivered to the lower substrate through the third plug 250.

In another embodiment, the third plug 250 electrically connecting the second image sensing device 220 and the first interconnection 180 may be formed after the second image sensing device 220 is formed.

Figure 6:
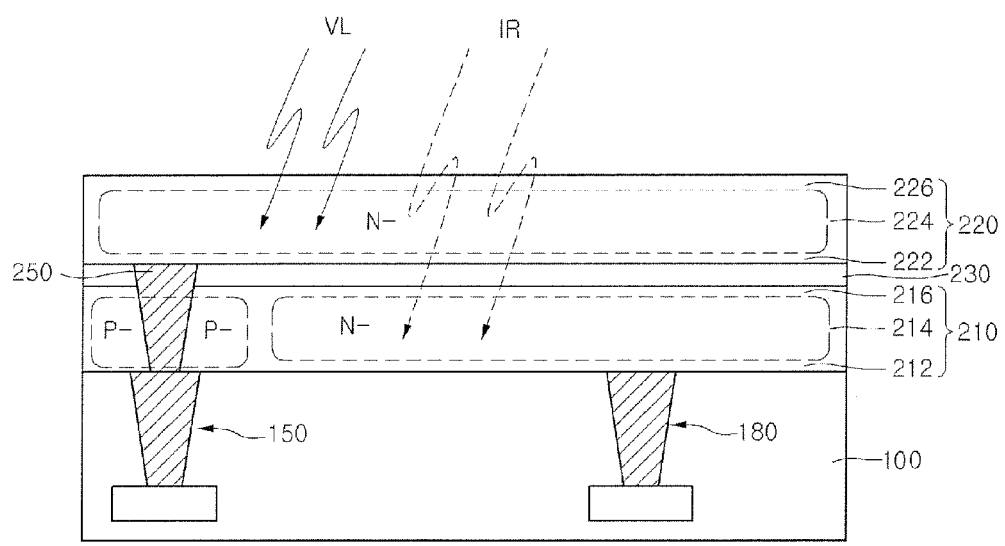
FIG. 6 shows a cross-sectional view illustrating a step in a method for manufacturing an image sensor according to a first embodiment.

Referring to FIG. 6, the second image sensing device 220 is formed on the separation layer 230. For example, the second image sensing device 210 including a first conductive layer 224 and a second conductive layer 226 can be formed on a third substrate (not shown). After the third substrate is bonded to the separation layer 230 such that the first conductive layer 224 connects with the third plug 250, the third substrate may be removed to leave the second image sensing device 220 on the separation layer 230. In an embodiment, the second image sensing device 220 may further include a high-density conductive layer 222 for an ohmic contact to the third plug 250.

According to an embodiment, a visible ray VL is detected by the second image sensing device 220 to be read out through the second interconnection 150. An infrared ray IR penetrates the second image sensing device 220 to reach the first image sensing device 210, thereby generating electrons. The infrared ray IR is read out through the first interconnection 180, thereby acquiring an image.

As an example of synthesizing two types of information, a method of directly controlling the synthesis by a dual channel structure and an imaging device may be adopted, but embodiments are not limited thereto.

For example, in the dual channel structure, after image signals are generated or manipulated two or more times, the image signals are processed, and finally synthesized into one image signal. Specifically, a long channel takes charge of a processing of an infrared ray, and a short channel takes charge of a processing of a visible ray. After signals obtained from a CIS is maximally preserved and processed, the signals are optimally synthesized according to dB of a monitor at the final stage.

In the method using an image device, the image device is directly exposed in pixel unit. Specifically, the image device directly synthesizes a long channel signal of an infrared ray and a short channel signal of a visible ray at a signal processing stage by controlling shutter timing, thereby acquiring a higher dynamic range using a simpler system than the dual channel structure.

Embodiments can provide an image sensor having a wide dynamic range by simultaneously manufacturing a visible ray pixel and an infrared ray pixel within a minimum area by a 3D image sensor.

Figure 7A:
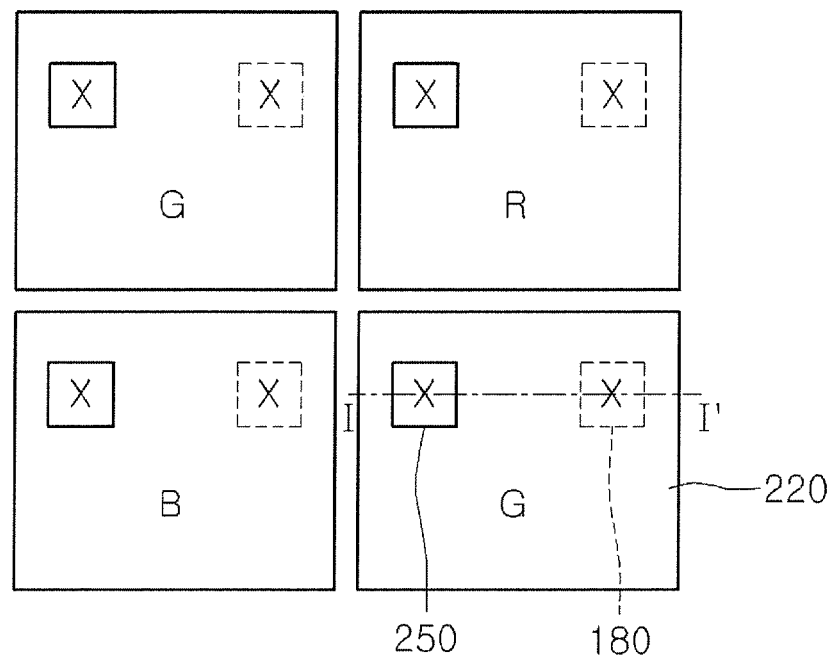
FIGS. 7A and 7B are plan views of image sensors in accordance with an embodiment.

FIG. 7A is a plan view illustrating an example of the image sensor according to the first embodiment. The cross-sectional view through line I-I' is illustrated in FIG. 6. FIG. 7A shows, as an example, that the first image sensing device 210 for sensing an infrared ray may be formed for each red (R), green (G), and blue (B) cell.

Figure 7B:
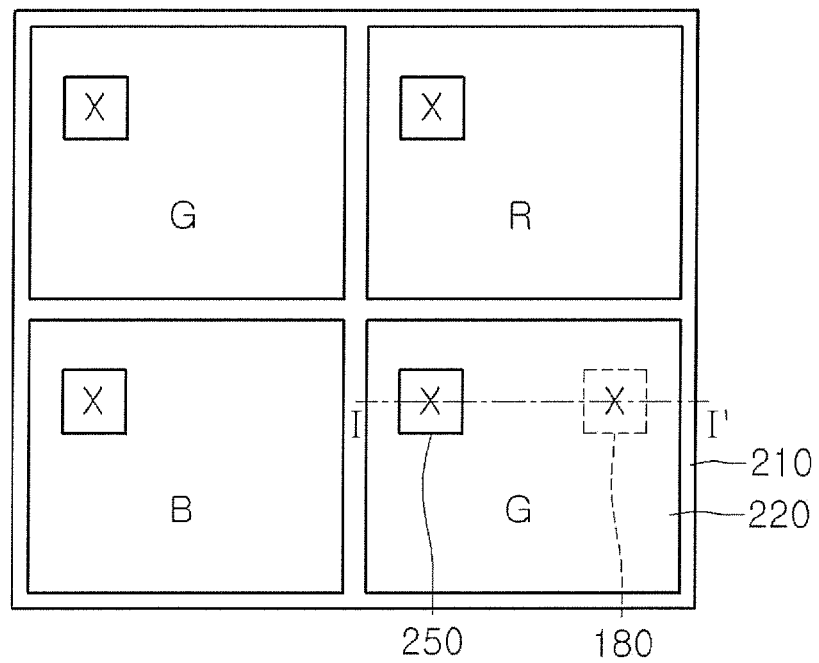

On the other hand, FIG. 7B is a plan view illustrating another example of the image sensor according to the first embodiment. The cross-sectional view through line I-I' can also be as shown in FIG. 6. FIG. 7B shows, as an example, that one first image sensing device 210 for sensing an infrared ray may be formed in a unit pixel including the R, G, B cells. For example, as shown in FIG. 7B, a single first image sensing device 210 connected to a first interconnection 180 can be provided below four second image sensing devices 220 corresponding to the four RGB cells.

An image sensor having a wide dynamic range can be provided by simultaneously manufacturing a high sensitivity pixel capable of sensing a visible ray and a low sensitivity pixel capable of sensing an infrared ray within a minimum area by a 3D image sensor.

Also, the device may be designed to provide a potential difference between the source and drain of a transfer transistor (Tx), thus implementing the full dumping of a photo charge.

Furthermore, a charge connection region is formed between a photodiode and a readout circuit to create a smooth transfer path of a photo charge, thereby making it possible to minimize a dark current source and inhibit saturation reduction and sensitivity degradation.

Figure 8:
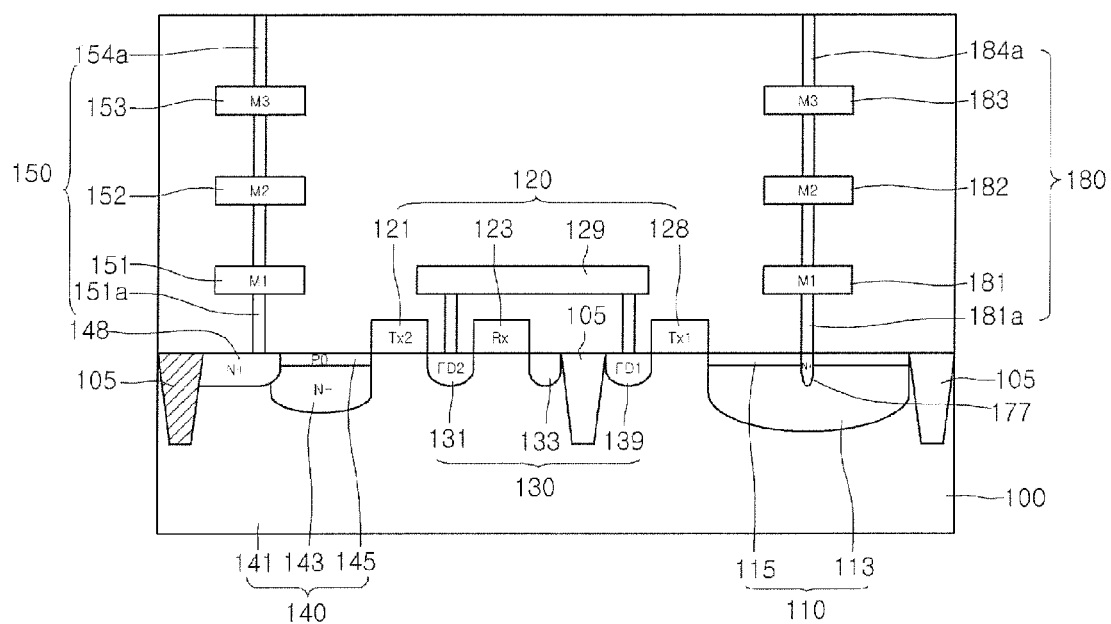
FIG. 8 is a cross-sectional view of a first substrate portion of an image sensor according to a second embodiment.

FIG. 8 is a cross-sectional view of an image sensor according to a second embodiment, providing a detail view of a first substrate including interconnections formed therein.

Referring to FIGS. 1 and 8, the image sensor according to the second embodiment may include a first substrate 100 including a readout circuitry 120 and first and second interconnections 180 and 150 electrically connected to the readout circuitry 120; a first image sensing device 210 formed on the first interconnection 180; and a second image sensing device 220 formed on the first image sensing device 210.

The second embodiment may adopt the technical features of the first embodiment.

Embodiments can provide an image sensor having a wide dynamic range by simultaneously manufacturing a high sensitivity pixel capable of sensing a visible ray and a low sensitivity pixel capable of sensing an infrared ray within a minimum area by a 3D image sensor.

Also, the device may be designed to provide a potential difference between the source and drain of a transfer transistor (Tx), thus implementing the full dumping of a photo charge.

Furthermore, a charge connection region is formed between a photodiode and a readout circuit to create a smooth transfer path of a photo charge, thereby making it possible to minimize a dark current source and inhibit saturation reduction and sensitivity degradation.

Unlike the first embodiment, a first conductive connection 148 is formed at a side of a second electrical junction region 140 instead of piercing into the second electrical junction region 140.

An N+ connection region 148 may be formed at a P0/N−/P− junction 140 for an ohmic contact. However, certain processes of forming the N+ connection region 148 and a M1C contact 151a may provide a leakage source. This is because an electric field (EF) may be generated over the Si surface of the substrate due to operation while a reverse bias is applied to P0/N−/P− junction 140. A crystal defect generated during the contact forming process inside the electric field may become a leakage source.

Also, when the N+ connection region 148 is formed over the surface of P0/N−/P− junction 140, an electric field may be additionally generated due to the N+/P0 junction 148/145. This electric field may also become a leakage source.

Therefore, the second embodiment proposes a layout in which first contact plug 151a is formed in an active region not doped with a P0 layer, but instead on a N+ connection region 148 that is electrically connected to the N− region 143.

According to the second embodiment, the electric field is not generated on and/or over the Si surface, contributing to reduction in a dark current of a 3D integrated CTS.

The first conductive connection 148 is shown formed at one side of the second electrical junction region 140 as an example in the second embodiment, but embodiments are not limited thereto. For example, the first conductive connection 177 may also be formed at one side of the first electrical region 110.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
    a readout circuitry on a first substrate;
    interconnections comprising a first interconnection and a second interconnection on the first substrate and electrically connected to the readout circuitry;
    a first image sensing device over the first interconnection;
    a second image sensing device over the first image sensing device and electrically connected to the second interconnection; and
    a third plug electrically connecting the second image sensing device to the second interconnection.

2. The image sensor according to claim 1, further comprising a separation layer between the first image sensing device and the second image sensing device.

3. The image sensor according to claim 2, wherein the separation layer comprises an insulating layer over the first image sensing device.

4. The image sensor according to claim 1, further comprising an electrical junction region in the first substrate and electrically connecting the first interconnection to the readout circuit.

5. The image sensor according to claim 4, further comprising a first conductive-type connection between the electrical junction region and the first interconnection.

6. The image sensor according to claim 5, wherein the first conductive-type connection is electrically connected to the first interconnection at an upper part of the electrical junction region.

7. The image sensor according to claim 5, wherein the first conductive connection is at one side of the electrical junction region and electrically connects the first interconnection to the electrical junction region.

8. The image sensor according to claim 4, wherein the electrical junction region comprises:
    a first conductive-type ion implantation region in the first substrate; and
    a second conductive-type ion implantation region on the first conductive ion implantation region.

9. The image sensor according to claim 4, wherein the readout circuitry has a potential difference between a source and a drain of a transistor, the electrical junction region being at the source of the transistor.

10. A method for manufacturing an image sensor comprising:
   forming a readout circuitry on a first substrate;
   forming interconnections comprising a first interconnection and a second interconnection on the first substrate and electrically connected to the readout circuitry;
   forming a first image sensing device over the first interconnection;
   forming a second image sensing device over the first image sensing device and electrically connected to the second interconnection;
   foming a separation layer over the first image sensing device before forming the second image sensing device over the first image sensing device; and
   forming a third plug over the second interconnection and penetrating the separation layer.

11. The method according to claim 10, wherein the forming of the separation layer comprises forming an insulating layer on the first image sensing device.

12. The method according to claim 10, wherein the forming of the third plug over the second interconnection and penetrating the separation layer comprises:
   after the forming of the second image sensing device, forming the third plug electrically connecting the second image sensing device and the second interconnection.

13. The method according to claim 10, further comprising forming an electrical junction region in the first substrate to be electrically connected to the readout circuitry.

14. The method according to claim 13, further comprising forming a first conductive connection between the electrical junction region and the first interconnection.

15. The method according to claim 14, wherein the first conductive connection is electrically connected to the first interconnection at an upper part of the electrical junction region.

16. The method according to claim 14, wherein the first conductive connection is at one side of the electrical junction region and electrically connects the first interconnection to the electrical junction region.

17. The method according to claim 13, wherein the forming of the electrical junction region comprises:
   forming a first conductive ion implantation region in the first substrate; and
   forming a second conductive ion implantation region on the first conductive ion implantation region.

* * * * *